United States Patent [19]
Akita

[11] 4,054,848
[45] Oct. 18, 1977

[54] ULTRASONIC OSCILLATOR

[75] Inventor: Sigeyuki Akita, Okazaki, Japan

[73] Assignee: Nippon Soken, Inc., Nishio, Japan

[21] Appl. No.: 778,744

[22] Filed: Mar. 17, 1977

Related U.S. Application Data

[63] Continuation of Ser. No. 632,900, Nov. 18, 1975, abandoned.

[30] Foreign Application Priority Data

Jan. 23, 1975   Japan ................................. 50-11316

[51] Int. Cl.² .................................... H03B 5/36
[52] U.S. Cl. ........................... 331/116 R; 310/317; 331/186
[58] Field of Search .......... 310/8.1, 26; 331/116 R, 331/185, 186, 117, 116 M; 307/315

[56] References Cited

U.S. PATENT DOCUMENTS

| | | | |
|---|---|---|---|
| 2,663,806 | 12/1953 | Darlington | 307/315 |
| 2,992,120 | 7/1961 | Elsken | 331/185 |
| 3,066,252 | 11/1962 | Drake et al. | 331/116 R |
| 3,387,228 | 6/1968 | Randall | 331/186 |
| 3,424,995 | 1/1969 | Parente | 331/185 |
| 3,512,107 | 5/1970 | Miyake et al. | 331/116 R |
| 3,539,944 | 11/1970 | Miyake et al. | 331/116 R |
| 3,681,626 | 8/1972 | Puskas | 310/8.1 |

Primary Examiner—John Kominski
Attorney, Agent, or Firm—Cushman, Darby & Cushman

[57] ABSTRACT

An ultrasonic oscillator, which can be mounted on a vehicle and which enables an oscillating element itself to generate a high ultrasonic energy, comprising a storage battery having one power line thereof grounded, a DC — DC converter which is electrically isolated from said power lines of the storage battery and which supplies D.C. power to non-grounded power lines thereof, and a Darlington transistor circuit having a ultrasonic oscillating element connected across base and collector thereof.

2 Claims, 2 Drawing Figures

ULTRASONIC OSCILLATOR

This is a continuation of application Ser. No. 632,900 filed Nov. 18, 1975, now abandoned.

BACKGROUND OF THE INVENTION

1. Field of the Invention

The present invention relates to an ultrasonic oscillator which drives an ultrasonic oscillating element serving as a load.

2. Description of the Prior Art

Cleaning or machining devices using ultrasonic wave have been put into practice and it has been recently proposed to use ultrasonic energy to facilitate atomization of fuel to be fed to an internal combustion engine of an automobile. As an example of an ultrasonic oscillator for generating ultrasonic energy, an arrangement shown in FIG. 1 is known in the art in which an oscillating element (ultrasonic oscillating element) 10 is connected across a base and a collector of a transistor 70 and a D.C. power source, such as a storage battery 1, is connected across terminals 3 and 4. With such an arrangement, when a current flows through the oscillating element 10 in the direction of an arrow $a$, an oscillation signal in accordance with an inherent oscillation frequency of the oscillating element 10 is generated. While it is possible to drive a load connected across the terminals 8 and 9, it is not possible to cause the oscillating element to generate a high ultrasonic energy because the oscillating element 10 cannot be supplied with high power. While a high voltage D.C. power source may be used in order to enable the oscillating element 10 itself to generate increased ultrasonic energy, it is a usual practice to use the storage battery 1 as a D.C. power source when an ultrasonic oscillator is mounted on an automobile. In an automobile, the vehicle body is used as a ground to which a terminal of the storage battery 1 is connected. Hence, if the oscillating element 10 is mounted on the vehicle body, and if a high voltage power line of the oscillating element 10 is brought into contact with the vehicle body or other electrical parts during maintenance and inspection operation, the electrical parts, or in certain cases the storage battery 1, are damaged and there also exists a risk that an operator may suffer a shock by touching the lead wire.

SUMMARY OF THE INVENTION

It is an object of the present invention to provide an ultrasonic oscillator which can be mounted on an automobile or the like and which enables an oscillating element itself to generate a high ultrasonic energy. The oscillator basically comprises a storage battery having one of its terminals grounded, a DC — DC converter which is electrically isolated from the power lines of the storage battery and which supplies D.C. power to non-grounded power lines of the converter, and a Darlington transistor circuit having an ultrasonic oscillating element connected across a base and a collector thereof.

According to the present invention, advantages are brought about in that the ultrasonic oscillating element is enabled to generate a high ultrasonic energy, and when the oscillator is mounted on an automobile or the like, there is no risk of damaging other electrical parts or giving a shock to an operator.

Other objects, features and advantages of the present invention will become more apparent from the following detailed description of a preferred embodiment of the invention when taken in conjunction with the accompanying drawings.

DESCRIPTION OF THE PREFERRED EMBODIMENT

Figure 1:
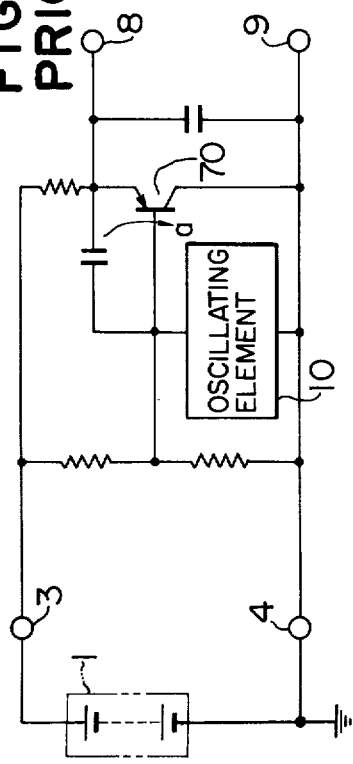
FIG. 1 is an electrical circuit diagram illustrating one example of the prior art ultrasonic oscillator described above.
Figure 2:
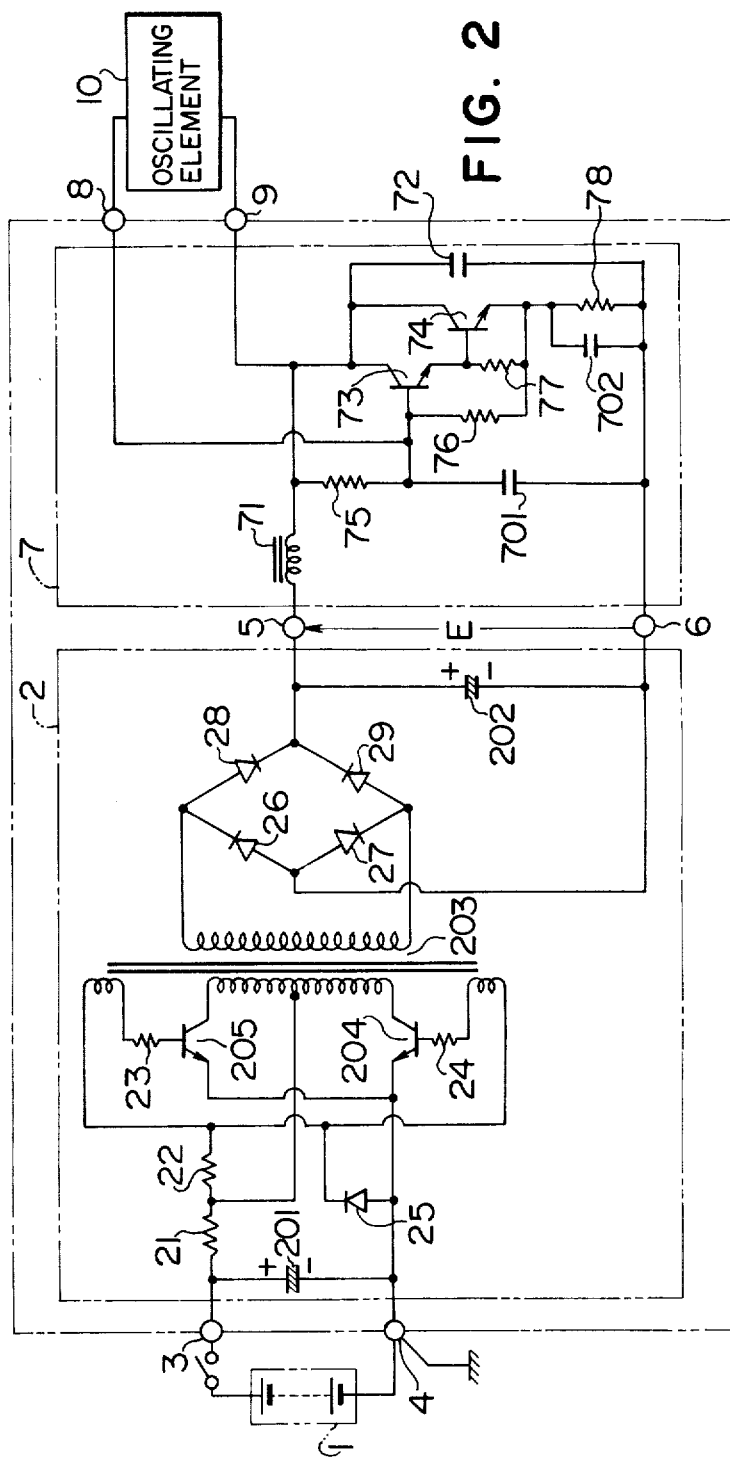
FIG. 2 is an electrical circuit diagram illustrating one embodiment of the present invention.

The present invention will now be explained in conjunction with an embodiment shown in FIG. 2, in which reference numeral 1 designates a storage battery mounted on a vehicle body having its negative terminal grounded to the vehicle body, 2 designates a DC — DC converter which is connected to the storage battery 1 at its terminals 3. The converter 4 and comprises resistors 21, 22, 23, 24, a back e.m.f. absorbing diode 25, rectifying diodes 26, 27, 28, 29, capacitors 201, 202, and transistors 204, 205 for switching on and off the supply of current to a primary winding of a transformer 203. Connected between the terminal 3 and the storage battery 1 is a switch. In the DC — DC converter 2, when the transistors 204 and 205 are started to alternately turn on and off by the switch, the transformer 203 produces an A.C. voltage across its secondary winding. Since this A.C. voltage is rectified by the diodes 26, 27, 28, 29, a D.C. voltage stepped up to a desired magnitude is developed across non-grounded terminals 5 and 6. Thus, the output power line terminals 5 and 6 of the DC — DC converter 2 are isolated from the power lines of the storage battery 1 because the primary winding and the secondary winding of the transformer 203 are electrically isolated from each other. Reference numeral 7 designates an oscillator circuit which comprises a choke coil 71 and a capacitor 72 for supplying a high voltage, transistors 73 and 74 of Darlington configuration, resistors 75, 76, 77, 78 and capacitors 701, 702. Across the collector and base of the transistor 73, that is, across the terminals 8, 9, an oscillating element (ultrasonic oscillating element) 10 is connected. The element 10, as known well in the art, consists of barium titanate, for example, and has an inherent oscillation frequency.

The operation of the oscillator circuit 7 and the oscillating element 10 now will be explained. When a D.C. voltage from the DC — DC converter 2 is applied across the terminals 5, 6, the voltage across the terminals 6, 9 becomes nearly equal to 2E at maximum (where E is a voltage across the terminals 5, 6,) due to the transient effect of a series connection of the choke coil 71 and the capacitor 72, provided that there is no loss in the oscillator circuit 7. Because of the voltage developed across the terminals 6, 9, a current flows from the terminal 9 to the oscillating element 10 and the capacitor 701 is charged. As a result, the base potential of the transistor 73 rises in accordance with a time constant determined by the oscillating element 10 and the capacitor 701. With the rise of the base potential, a current flowing into bases of the Darlington configurated transistors 73, 74 increases and the transistors 73, 74 are rendered conductive. As a result, the charge which has been stored in the capacitor 701 is discharged into the transistors 73, 74 and the potential at the terminal 9 begins to fall. Since the collector of the transistor 73 is connected to the base of the transistor 73 through the oscillating element 10, the base potential of the transistor 73 also begins to fall with the fall of the potential at the terminal 9, and the transistors 73, 74 are eventually inverted to their non-conduction states. Upon the inversion of the transistors 73, 74, the potential at the terminal 9 again starts to rise to approximately 2E by the transient effect in the above-described manner so that the capacitor 701 is charged. The above operation is repeated and oscillation dependent on the inherent oscillation frequency of the oscillating element 10 is caused. In this manner, since the voltage across the oscillating element 10 is approximately two times as large as the voltage E across the terminals 5, 6, and the oscillating element 10 is driven by the Darlington configurated transistors 73, 74, the voltage across the oscillating element 10 is large and the oscillating element 10 itself positively feeds back to the oscillator circuit 7 and generates a high ultrasonic energy while serving as a load.

In an attempt to accelerate the atomization of the fuel fed to an internal combustion engine (not shown) mounted in an automobile or the like by the ultrasonic energy, when the oscillating element 10 serving as the load is mounted on the vehicle body or vehicle chassis, contact of the lead wire of the oscillating element 10 with other electrical parts mounted on the automobile will not cause damage of the parts and the operator's touching the lead wire will not cause a shock because the nongrounded power lines which directly feed power to the oscillating element 10 are electrically separated from the grounded storage battery 1 by the transformer 203. Thus, the DC — DC coverter 2 permits in mounting the oscillating element 10, which can supply high power, on the automobile or the like.

In the above embodiment, the choke coil 71 may be eliminated if the output voltage of the DC — DC converter 2 is sufficiently high.

What is claimed is:

1. An ultrasonic oscillator for automobiles comprising:
   a storage battery for supplying D.C. power, said battery having a pair of terminals one of which is grounded;
   a DC-DC converter connected across said storage battery for supplying stepped-up D.C. power to a pair of ungrounded converter output power lines which are electrically isolated by the converter from said storage battery terminals;
   an oscillator circuit including a series circuit of a choke coil and a capacitor connected across said output power lines, and a Darlington transistor configuration, having emitter, collector and base terminals, the collector and emitter terminals of the transistor configuration being connected across said capacitor, said choke coil being adapted to raise voltage at said collector terminal of said transistor configuration to a level higher than D.C. voltage produced across said output power lines; and
   an ultrasonic oscillator connected across the base and collector terminals of said Darlington transistor configuration for positively feeding back voltage at said collector terminal to the base terminal to thereby establish the oscillation frequency of said oscillator circuit, whereby said oscillator receives the higher level voltage raised by said choke coil to generate high ultrasonic energy.

2. An ultrasonic oscillator according to claim 1, wherein said DC — DC converter comprises a transformer having a primary winding and a secondary winding for producing an A.C. voltage, a pair of transistors connected across said primary winding and arranged to be repeatedly turned on and off alternately, and a full-wave rectifier connected across said secondary winding for rectifying said A.C. voltage into a D.C. voltage.

* * * * *